(12) United States Patent
Goto et al.

(10) Patent No.: US 12,278,614 B2
(45) Date of Patent: Apr. 15, 2025

(54) MULTILAYER PIEZOELECTRIC SUBSTRATE WITH REDUCED SIDE LEAKAGE AND TRANSVERSE MODE SUPPRESSION

(71) Applicant: SKYWORKS SOLUTIONS, INC., Irvine, CA (US)

(72) Inventors: Rei Goto, Osaka (JP); Gong Bin Tang, Moriguchi (JP); Keiichi Maki, Suita (JP); Hironori Fukuhara, Ibaraki (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 169 days.

(21) Appl. No.: 17/812,761

(22) Filed: Jul. 15, 2022

(65) Prior Publication Data
US 2023/0013597 A1    Jan. 19, 2023

Related U.S. Application Data

(60) Provisional application No. 63/222,559, filed on Jul. 16, 2021.

(51) Int. Cl.
*H03H 9/02* (2006.01)
*H03H 3/08* (2006.01)
(Continued)

(52) U.S. Cl.
CPC .......... *H03H 9/02866* (2013.01); *H03H 3/08* (2013.01); *H03H 9/02574* (2013.01);
(Continued)

(58) Field of Classification Search
CPC .. H03H 9/02866; H03H 3/08; H03H 9/02574; H03H 9/02992; H03H 9/145;
(Continued)

(56) References Cited

U.S. PATENT DOCUMENTS

2021/0058057 A1    2/2021 Goto et al.
2021/0067136 A1    3/2021 Fujiwara et al.
(Continued)

FOREIGN PATENT DOCUMENTS

CN    112994638 A   *   6/2021

*Primary Examiner* — Andrea Lindgren Baltzell
*Assistant Examiner* — Kimberly E Glenn
(74) *Attorney, Agent, or Firm* — Lando & Anastasi, LLP

(57) ABSTRACT

An acoustic wave device, a method of manufacture of the same, and a radio frequency filter including the same. The acoustic wave device comprises a multilayer piezoelectric substrate (MPS) including a layer of piezoelectric material having a lower surface disposed on an upper surface of a layer of a dielectric material having a lower surface disposed on an upper surface of a carrier substrate. An interdigital transducer (IDT) is disposed on the multilayer piezoelectric substrate and includes an active region configured to generate an acoustic wave. First and second high impedance portions are included within the multilayer piezoelectric substrate, the first and second high impedance portions each positioned outside the active region of the interdigital transducer and extending in the direction of propagation of the acoustic wave to be generated by the interdigital transducer. The first and second high impedance portions reduce side leakage and suppress transverse modes.

20 Claims, 13 Drawing Sheets

(51) Int. Cl.
*H03H 9/145* (2006.01)
*H03H 9/25* (2006.01)
*H03H 9/64* (2006.01)

(52) U.S. Cl.
CPC ........ *H03H 9/02992* (2013.01); *H03H 9/145* (2013.01); *H03H 9/25* (2013.01); *H03H 9/6483* (2013.01); *H03H 9/6489* (2013.01)

(58) Field of Classification Search
CPC ...... H03H 9/25; H03H 9/6483; H03H 9/6489; H03H 9/02818
USPC ........................................................ 333/193
See application file for complete search history.

(56) References Cited

U.S. PATENT DOCUMENTS

| | | |
|---|---|---|
| 2021/0126624 A1 | 4/2021 | Hiramatsu et al. |
| 2021/0159886 A1 | 5/2021 | Goto et al. |

* cited by examiner

MULTILAYER PIEZOELECTRIC SUBSTRATE WITH REDUCED SIDE LEAKAGE AND TRANSVERSE MODE SUPPRESSION

CROSS-REFERENCE TO RELATED APPLICATIONS

This application claims priority under 35 U.S.C. § 119(e) to U.S. Provisional Patent Application Ser. No. 63/222,559, titled "MULTILAYER PIEZOELECTRIC SUBSTRATE WITH REDUCED SIDE LEAKAGE AND TRANSVERSE MODE SUPPRESSION," filed Jul. 16, 2021, the entire contents of which is incorporated herein by reference for all purposes.

BACKGROUND

Field

Embodiments of the invention relate to a multilayer piezoelectric substrate with reduced side leakage and transverse mode suppression, and in particular an acoustic wave device, a method of manufacture of the same, and a radio frequency filter including the same.

Description of the Related Technology

Multilayer piezoelectric substrates (MPSs) are often used in acoustic wave devices, such as surface acoustic wave (SAW) devices. For example, FIGS. 1A and 1B show a side view and plan view of a conventional MPS SAW device. The SAW device 100 of FIGS. 1A and 1B includes a carrier substrate 102, a layer of dielectric material 104 disposed on an upper surface of the carrier substrate 102, and a layer of piezoelectric material 106 disposed on the layer of dielectric material 104. An interdigital transducer (IDT) 108 is disposed on top of the layer of piezoelectric material 106.

The IDT shown in FIGS. 1A and 1B includes a pair of interlocking comb shaped electrodes, each including a bus bar electrode 108a, a plurality of electrode fingers 108b that extend from the bus bar electrode 108a, typically perpendicularly, and a plurality of dummy electrode fingers 108c. The main surface acoustic wave generated by the IDT travels perpendicular to the lengthwise direction of the IDT electrodes fingers 108b, and parallel to the lengthwise direction of the IDT bus bar electrodes 108a.

An MPS SAW device such as that shown in FIGS. 1A and 1B can result in a device, for example a SAW filter, with a good Q factor, a large electromechanical coupling coefficient ($K^2$) and a high power durability. However, transverse modes and Q factor reduction due to side leakage can both degrade the performance of the SAW device.

To reduce the transverse modes and side leakage, SAW devices using a slanted IDT structures have been proposed. However, slanted IDTs require additional space on the layer of piezoelectric material leading to a larger device, and result in a hard obstacle for size reduction.

SUMMARY

According to one embodiment there is provided an acoustic wave device. The acoustic wave device comprises a multilayer piezoelectric substrate, the multilayer piezoelectric substrate including a layer of piezoelectric material having a lower surface disposed on an upper surface of a layer of a dielectric material, the dielectric material having a lower surface disposed on an upper surface of a carrier substrate. An interdigital transducer is disposed on the multilayer piezoelectric substrate, the interdigital transducer including an active region configured to generate an acoustic wave, and first and second high impedance portions included within the multilayer piezoelectric substrate, the first and second high impedance portions each positioned outside the active region of the interdigital transducer and extending in the direction of propagation of the acoustic wave to be generated by the interdigital transducer.

In one example the first and second high impedance portions are included within the layer of dielectric material and/or the layer of piezoelectric material.

In one example the first and second high impedance portions are air gaps.

In one example the first and second high impedance portions are formed from a material of high impedance.

In one example the material of high impedance includes at least one of silicon nitride, silicon, diamond, aluminum nitride, magnesium oxide spinel, magnesium oxide crystal, quartz, diamond-like carbon, and sapphire.

In one example the first and second high impedance portions are formed by etching or dicing the layer of dielectric material and/or the layer of piezoelectric material during formation of the multilayer piezoelectric substrate.

In one example the first and second high impedance portions are located on opposing sides of the active region of the interdigital transducer.

In one example the first and second high impedance portions are configured to confine acoustic waves within the region of the multilayer piezoelectric substrate below the active region of the interdigital transducer.

In one example the first and second high impedance portions extend along the entire length of the interdigital transducer in the direction of propagation of the acoustic wave to be generated by the interdigital transducer.

In one example the interdigital transducer includes a pair of opposing bus bar electrodes and a plurality of interlocking electrode fingers that extend from each of the bus bar electrodes and overlap in the active region of the interdigital transducer.

In one example the first and second high impedance portions are each located adjacent to an edge of the active region, or adjacent to an inner edge of one of the bus bar electrodes, or therebetween.

In one example each of the first and second high impedance portions has a width in the direction perpendicular to the direction of propagation of the main acoustic wave to be generated by the interdigital transducer equal to or greater than about $1\lambda$, where $\lambda$ is the wavelength of the main acoustic wave to be generated.

In one example the layer of piezoelectric material and the layer of dielectric material each have a thickness of between about $0.1\lambda$ and about $1\lambda$, where $\lambda$ is the wavelength of the main acoustic wave generated by the interdigital transducer during operation.

In one example the first and second high impedance portions each have a height in the direction perpendicular to the plane of the multilayer piezoelectric substrate equal to or greater than about half the thickness of the layer of dielectric material or the layer of piezoelectric material.

In one example the layer of piezoelectric material is formed of a material selected from the group consisting of lithium tantalate, aluminum nitrate, lithium niobate, or potassium niobate. In one example the layer of dielectric material includes silicon dioxide, or doped silicon material.

In one example the carrier substrate is formed of a material selected from the group consisting of silicon, aluminum nitride, silicon nitride, magnesium oxide spinel, magnesium oxide crystal, quartz, diamond, diamond-like carbon, or sapphire.

In one example the interdigital transducer is formed from at least one of aluminum, titanium, chromium, molybdenum, tungsten, copper, gold, silver, platinum, ruthenium, and iridium.

According to another embodiment there is provided a method of manufacturing an acoustic wave device. The method comprises providing a carrier substrate and a piezoelectric substrate, disposing a layer of dielectric material on an upper surface of the carrier substrate and on a lower surface of the piezoelectric substrate, forming first and second high impedance portions within the layer of dielectric material and/or the layer of piezoelectric material, joining the carrier substrate and a piezoelectric substrate via the layer of dielectric material, and disposing an interdigital transducer on an upper surface of the layer of piezoelectric material, said interdigital transducer including an active region positioned between the first and second high impedance portions and configured to generate an acoustic wave, with the first and second high impedance portions extending in the direction of propagation of the acoustic wave to be generated.

According to another embodiment there is provided a radio frequency filter comprising at least one acoustic wave device. The acoustic wave device includes a multilayer piezoelectric substrate, the multilayer piezoelectric substrate including a layer of piezoelectric material having a lower surface disposed on an upper surface of a layer of a dielectric material, the dielectric material having a lower surface disposed on an upper surface of a carrier substrate, an interdigital transducer disposed on the multilayer piezoelectric substrate, the interdigital transducer including an active region configured to generate an acoustic wave, and first and second high impedance portions included within the multilayer piezoelectric substrate, the first and second high impedance portions each positioned outside the active region of the interdigital transducer and extending in the direction of propagation of the acoustic wave to be generated by the interdigital transducer.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to an acoustic wave device, a method of manufacture of the same, and a radio frequency filter including the same. The acoustic wave device comprises a multilayer piezoelectric substrate (MPS), the multilayer piezoelectric substrate including a layer of piezoelectric material having a lower surface disposed on an upper surface of a layer of a dielectric material, the dielectric material having a lower surface disposed on an upper surface of a carrier substrate. An interdigital transducer (IDT) is disposed on the multilayer piezoelectric substrate, the interdigital transducer including an active region configured to generate an acoustic wave. First and second high impedance portions are included within the multilayer piezoelectric substrate, the first and second high impedance portions each positioned outside the active region of the interdigital transducer and extending in the direction of propagation of the acoustic wave to be generated by the interdigital transducer. The first and second high impedance portions reduce side leakage and suppress transverse modes.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Aspects and embodiments are described below through examples of the acoustic wave device, in particular surface acoustic wave (SAW) devices. However, as would be understood by the skilled person, various different excitation modes are possible in acoustic wave filters and devices, particularly MPS devices. As well as surface acoustic waves other types of acoustic wave are possible such as boundary acoustic waves and guided acoustic waves. References to surface acoustic waves and surface acoustic wave (SAW) devices in the following description are not intended to limit the disclosure from including or covering other possible types of acoustic waves and acoustic wave devices.

Figure 2A:
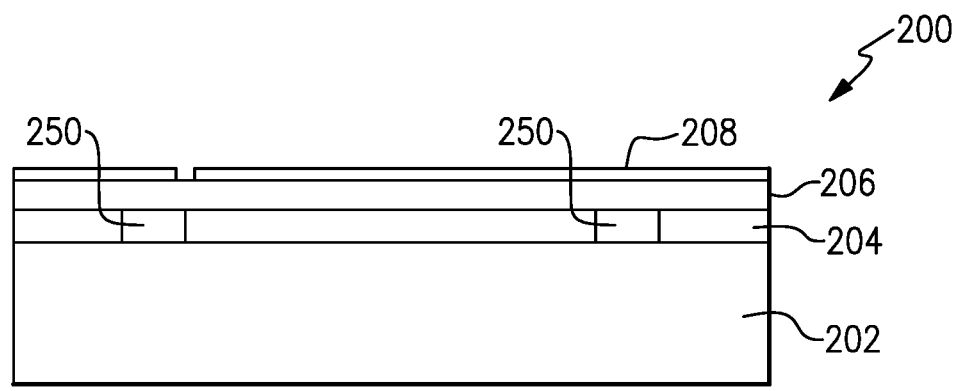
FIG. 2A is a cross-sectional view of an acoustic wave device according to aspects of the present invention.
Figure 2B:
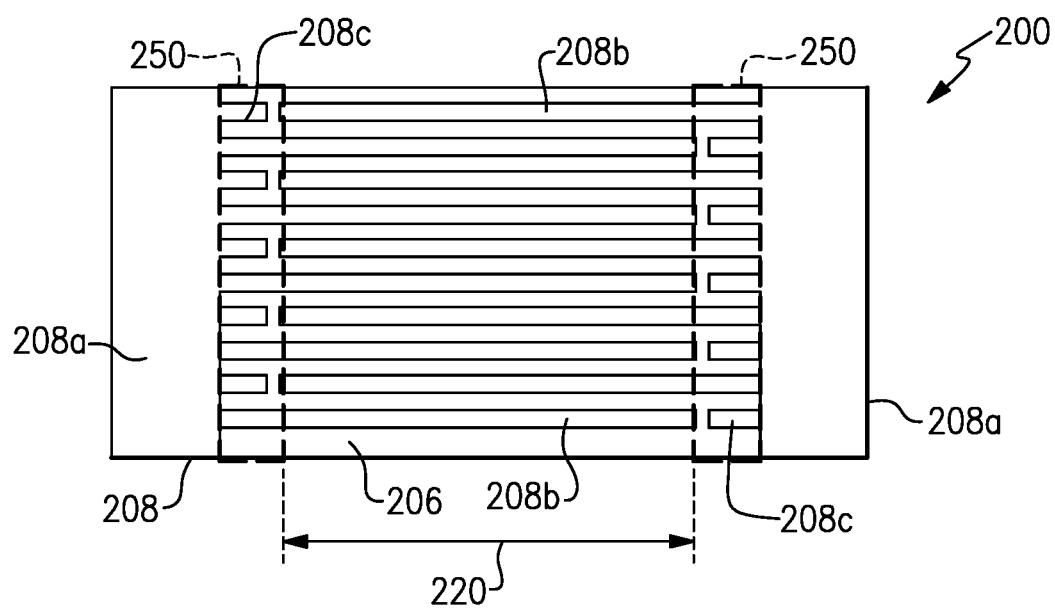
FIG. 2B is a plan view of an acoustic wave device according to aspects of the present invention.

FIGS. 2A and 2B shown a cross-sectional view and a plan view respectively of a surface acoustic wave (SAW) device 200 in an embodiment of the present invention. The SAW device 200 includes a multilayer piezoelectric substrate with a high impedance portion/air gap structure, as will be explained below.

The SAW device 200 includes a carrier substrate 202, a layer of dielectric material 204 disposed on an upper surface of the carrier substrate 202, and a layer of piezoelectric material 206 disposed above the layer of dielectric material 204 on the upper surface of the carrier substrate 202. Together the carrier substrate 202, layer of dielectric material 204, and layer of piezoelectric material 206 may be referred to as a multilayer piezoelectric substrate (MPS).

Any piezoelectric material may be used as the layer of piezoelectric material 206, for example, including but not limited to lithium tantalate ($LiTaO_3$), aluminum nitride (AlN), lithium niobate ($LiNbO_3$), or potassium niobate ($KNbO_3$). Various materials may also be used in the layer of dielectric material 204 and in the carrier substrate 202. One example of a material that may be utilized for the layer of dielectric material 204 is silicon dioxide ($SiO_2$). Other examples may include doped materials such as F doped $SiO_2$, or Ti doped $SiO_2$. One example of a material that may be utilized for the carrier substrate 202 is silicon (Si), however, aluminum nitride, silicon nitride, magnesium oxide spinel, magnesium oxide crystal, quartz, diamond, DLC (diamond-like carbon) and sapphire may all also be used as the carrier substrate.

The carrier substrate 202 may be formed of a material having a lower coefficient of linear expansion and/or a higher thermal conductivity and/or a higher toughness or mechanical strength than the piezoelectric material. The carrier substrate 202 may both increase the mechanical robustness of the piezoelectric material during fabrication of the SAW device and increase manufacturing yield, as well as reduce the amount by which operating parameters of the SAW device change with temperature during operation.

An interdigital transducer (IDT) 208 is disposed on top of the layer of piezoelectric material 206 and is configured to generate a surface acoustic wave in the multilayer piezoelectric substrate. In use, the IDT 208 excites a main acoustic wave having a wavelength $\lambda$ along a surface of the multilayer piezoelectric substrate. The acoustic wave is concentrated in the top two layers (the layer of dielectric material 204 and layer of piezoelectric material 206). The carrier substrate 202 (in this case silicon) may have a high impedance meaning the acoustic wave is reflected at the boundary between the carrier substrate 202 and the layer of dielectric material 204, confining the surface acoustic wave in the top two layers. In some embodiments, the thickness of the layer of dielectric material 204 may be between $0.1\lambda$ and $1\lambda$, and the thickness of the layer of piezoelectric material 206 may be between $0.1\lambda$ and $1\lambda$.

Any type of IDT may be used as the IDT 208 in the SAW device 200. For example, a typical IDT will include a pair of interlocking comb shaped electrodes. Each electrode of the IDT typically includes a bus bar electrode 208a and a plurality of electrode fingers 208b that extend perpendicularly from the bus bar electrode 208a, and a plurality of dummy electrode fingers 208c. Typically the distance between the central point of each adjacent electrode finger 208b extending from the same bus bar electrode 208a is equal to the wavelength $\lambda$ of the surface acoustic wave generated. The bus bar electrodes 208a of each of the pair or IDT electrodes are parallel and opposing each other, and the plurality of electrode fingers 208b of each IDT electrode extend towards to the bus bar electrode 208a of the opposing electrode, such that the electrode fingers 208b interlock, typically with a distance of $\lambda/2$ between the center of each adjacent electrode finger 208b extending from opposite bus bar electrodes 208a.

The dummy electrode fingers 208c extend from the bus bar electrodes 208a, typically perpendicularly. Each dummy electrode finger 208c is aligned with respective electrode finger 208b that extends from the opposite bus bar electrode 208a and has a width similar to that of the respective electrode finger 208b in the propagation direction. Each dummy electrode fingers 208c extends a shorter distance away from the bus bar electrode 208a than the distance extended by each electrode finger 208c. A gap is formed between the end of each dummy electrode finger 208c and the respective electrode finger 208b, preventing electrical contact between the two IDT electrodes.

The main surface acoustic wave generated by the IDT travels perpendicular to the lengthwise direction of the IDT electrodes fingers 208b, and parallel to the lengthwise direction of the IDT bus bar electrodes 208a. The surface acoustic wave is generated in an active region 220 of the IDT. The active region 220 is defined as the region in which the IDT electrodes fingers 208b overlap. In other words, the active region is the area bounded by the gaps formed between the end of each dummy electrode fingers 208c and the respective electrode finger 208b.

In some embodiments, the dummy electrodes 208c may extend about 0λ to about 3λ from the bus bar electrodes 208a. The gaps between the end of each dummy electrode finger 208c and the respective electrode finger 208b may have widths of between about 0.1λ and about 2λ. The active region 220 may have a width of between about 5λ and about 50λ. It is to be understood that these dimensions are only examples and may be set at different values in different embodiments of SAW devices to achieve different design goals.

Other types of IDT may be used, as would be understood by the skilled person, for example double electrode IDTs, or IDTs without dummy electrode fingers may be used. An example of one alternative IDT structure will be described in relation to FIGS. 6A and 6B later. In general, the IDT may be formed out of various conductive materials. For example, the IDT may contain at least one of aluminum, titanium, chromium, molybdenum, tungsten, copper, gold, silver, platinum, ruthenium, or iridium. In some embodiments the SAW device may include a buffer layer or temperature compensation layer disposed on an upper surface of the IDT electrodes and layer of piezoelectric material 206, to form a temperature-compensated SAW device, or TCSAW. The temperature compensation layer may be made from silicon dioxide, however a number of other dielectric materials may be used having a TCF property, such as tellurium dioxide, or aluminum nitride, for example. The IDT will typically also include input/output terminals (not shown).

The SAW device 200 also includes first and second high impedance portions 250 (also referred to herein as the high impedance portions 250). In the present embodiment, the high impedance portions 250 are located within the layer of dielectric material 204, however the high impedance portions 250 may be included in other layers of the MPS, as will be discussed below. The high impedance portions 250 may be formed from any high impedance material, meaning a material with a high acoustic impedance such that acoustic waves cannot readily propagate through said material. In the present embodiment, the high impedance portions are air gaps, with air constituting the high impedance material (air has an infinite impedance for surface acoustic waves). However other materials may also be used, as long as they have a high impedance. Examples include but are not limited to silicon nitride (SiN), silicon (Si), diamond, aluminum nitride, magnesium oxide spinel, magnesium oxide crystal, quartz, DLC (diamond-like carbon) and sapphire.

The high impedance portions 250 are positioned adjacent to the IDT active region 220 and extend in the direction of propagation of the main surface acoustic wave generated by the IDT 208 (parallel to the lengthwise direction of the bus bar electrodes 208a). Specifically, the high impedance portions 250 are positioned outside the region of the MPS that is underneath the active region 220 of the IDT 208. In other words, the high impedance portions 250 are positioned outside the footprint of the IDT active region 220. The first and second high impedance portions are located on opposing sides of the active region 220 of the IDT, so as to sandwich the IDT active region 220 between the high impedance portions 250. The high impedance portions 250 may extend along the entire length of the IDT 208 in the direction of propagation of the surface acoustic wave to be generated by the interdigital transducer.

The high impedance portions 250 therefore form a boundary along the edges of the IDT active region 220 parallel to the direction of propagation of the main surface acoustic wave. When any surface acoustic wave reaches the boundary the high impedance material/air gap of the high impedance portions 250 will prevent the acoustic wave from propagating through the high impedance portions 250. Instead the acoustic wave will be reflected at the boundary between the layer of dielectric material 204 and the high impedance portions 250, back into the layer of dielectric material 204. In this way, the high impedance portions of the MPS can efficiently confine the acoustic energy within the region of the MPS below the IDT active region 220.

In the embodiment of FIGS. 2A and 2B the high impedance portions 250 are directly adjacent to the active region 220, shown by the dotted outline in FIG. 2B, so that the high impedance portions 250 extend along the outside edge of the footprint of the IDT active region 220. The high impedance portions 250 also have a width substantially equal to the length of the dummy electrodes 208c. The high impedance portions 250 therefore align entirely with the dummy electrodes 208c in the embodiment of FIG. 2B. However, other configurations are also possible. For example, in some embodiments the length of the dummy electrodes 208c may be smaller or larger than the width of the high impedance portions 250, meaning that when the high impedance portions 250 are located directly adjacent to the outside edge of the active region 220, the width of the high impedance portions may extend further or less far than the dummy electrodes 208c.

Figure 2C:
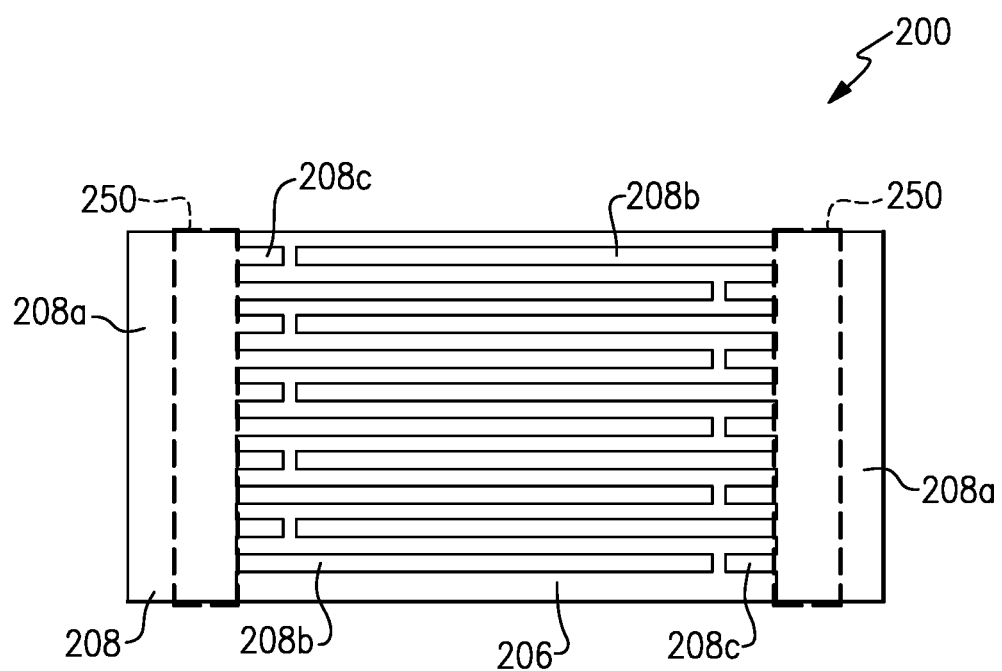
FIG. 2C is a plan view of an acoustic wave device according to aspects of the present invention.

Moreover, in some embodiments the high impedance portions 250 could be located outside the IDT active region 220 and slightly away from the edge of the active region. For example, FIG. 2C shows an embodiment where the first and second high impedance portions 250 are each located adjacent to an inner edge of one of the bus bar electrodes 208a, rather than directly adjacent to the edge of the active region 220. The dashed line in FIG. 2C shows the location of the high impedance portions 250 in the MPS underneath the IDT 208. In general, the high impedance portions 250 may be located at any position between the two extremes shown in FIGS. 2B and 2C.

Explaining this further, the high impedance portions 250 should located in the MPS outside the footprint of the IDT active region 220 as otherwise the active region would be affected and the high impedance portions would degrade the waveform of the surface acoustic wave generated. One desirable position of the high impedance portions 250 is shown in FIG. 2B, where the high impedance portions are aligned with the edge of the active region 220 of the IDT 208. The high impedance portions 250 may be moved further away from the IDT active region 220, however this can lead to scattering of the principle surface acoustic wave generated by the IDT. A small shift of the high impedance portions 250, up to the position shown in FIG. 2C where the high impedance portions are aligned with the inner edges of the bus bar electrodes 208a, is acceptable.

Preferably the width of the first and second high impedance portions 250 in the direction extending away from the IDT active region 220 (i.e., parallel to the lengthwise direction of the electrode fingers 208b) is equal to the wavelength λ of the main surface acoustic wave generated by the IDT 208. This is the minimum width for the high impedance portions 250 to effectively reflect the surface acoustic wave. The width of the high impedance portions 250 may be increased to greater that the wavelength λ, however this can lead to structural weakening of the device in the case of air gaps being used as the high impedance portions. Using a solid material to form the high impedance portions 250 can overcome this structural weakening.

The first and second high impedance portions 250 may be formed during formation of the MPS. For example, in some embodiments, the carrier substrate 202 may be provided in the form of a silicon wafer that is bonded to the lower surface of a wafer of piezoelectric material opposite the upper surface of the wafer of piezoelectric material upon which features of SAW devices, such as IDT electrodes, may be formed. The silicon may be bonded to the piezoelectric material via a thin layer of dielectric material (the layer of dielectric material 204). In some embodiments, a layer of silicon dioxide may be grown or deposited on the lower surface of the piezoelectric material and a layer of silicon dioxide may be grown or deposited on the upper surface of the silicon material. The high impedance portions may then be formed in either or both of these layers of silicon dioxide, before the carrier substrate and piezoelectric material are bonded together. The high impedance portions 250 may be formed by etching or dicing or the like, as will be discussed in more detail below. Once the high impedance portions 250 are formed, the piezoelectric material and silicon may be joined by anodic bonding or other methods of joining layers of silicon dioxide known in the art, to form the layer of dielectric material 204 including the high impedance portions 250.

The MPS configuration described above, particularly the high impedance portions 250, provide a SAW device 200 with improved performance characteristics, without any increase in size of the SAW device. In particular, the high impedance portions 250 reduce side leakage and suppress transverse modes. This is shown through the simulations results of FIGS. 3A to 3D.

Figure 1A:
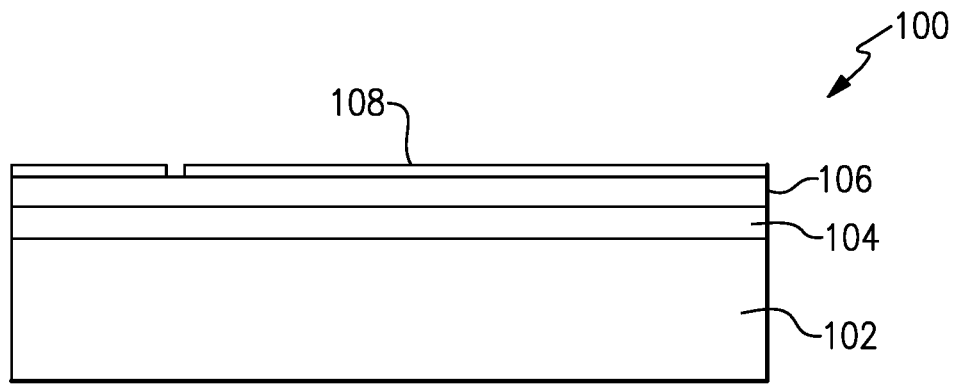
FIG. 1A is a cross-sectional view of an exemplary conventional SAW device.
Figure 1B:
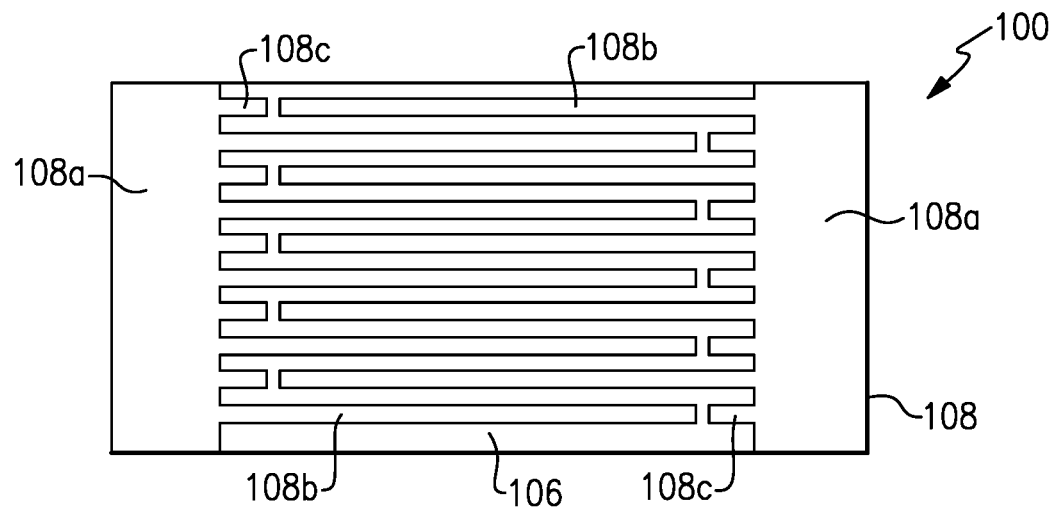
FIG. 1B is a plan view of an exemplary conventional SAW device.
Figure 3A:
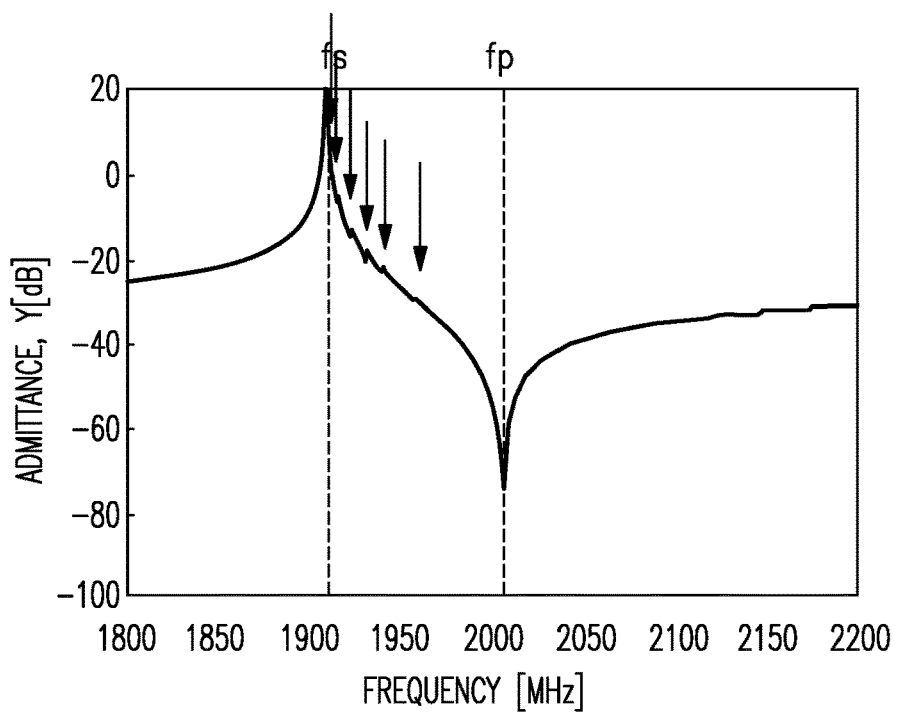
FIG. 3A is a graph illustrating admittance characteristics of an exemplary conventional acoustic wave device.
Figure 3B:
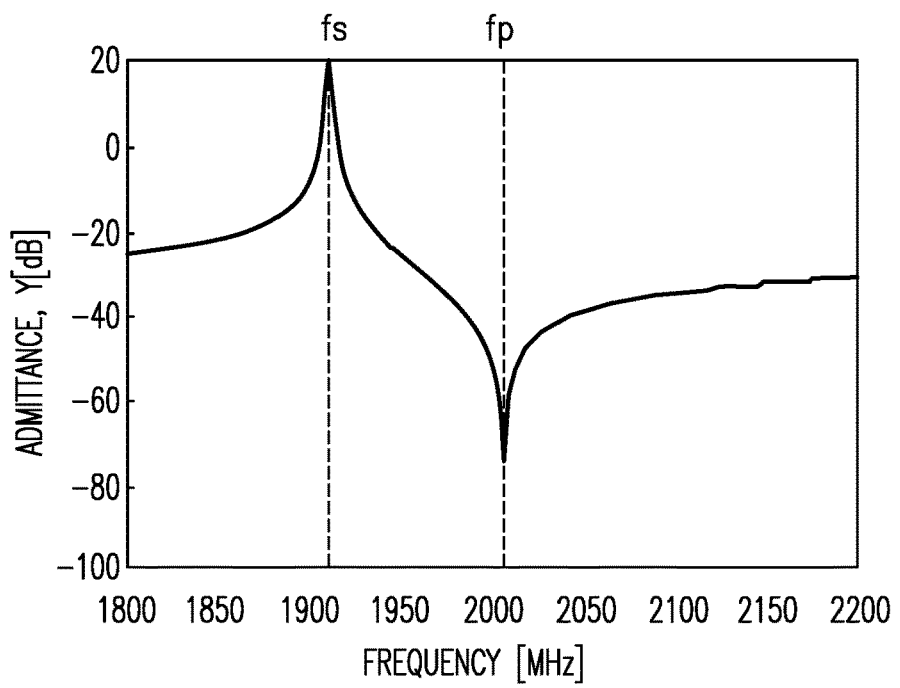
FIG. 3B is a graph illustrating admittance characteristics of an acoustic wave device according to aspects of the present disclosure.

FIG. 3A shows the results of a simulation of the frequency response of the complex admittance of an acoustic wave resonator using a conventional device such as that shown in FIGS. 1A and 1B. FIG. 3B shows the results of a simulation of the frequency response of the complex admittance of an acoustic wave resonator using a device such as the acoustic wave device 200 of FIGS. 2A and 2B.

As can be seen from the simulations, the transverse modes (marked by the arrows) present between the series resonance frequency fs and the parallel resonance frequency fp in the admittance curve of FIG. 3A for a conventional device are suppressed in the admittance curve of FIG. 3B, due to the high impedance portions 250 of the acoustic wave device 200.

Figure 3C:
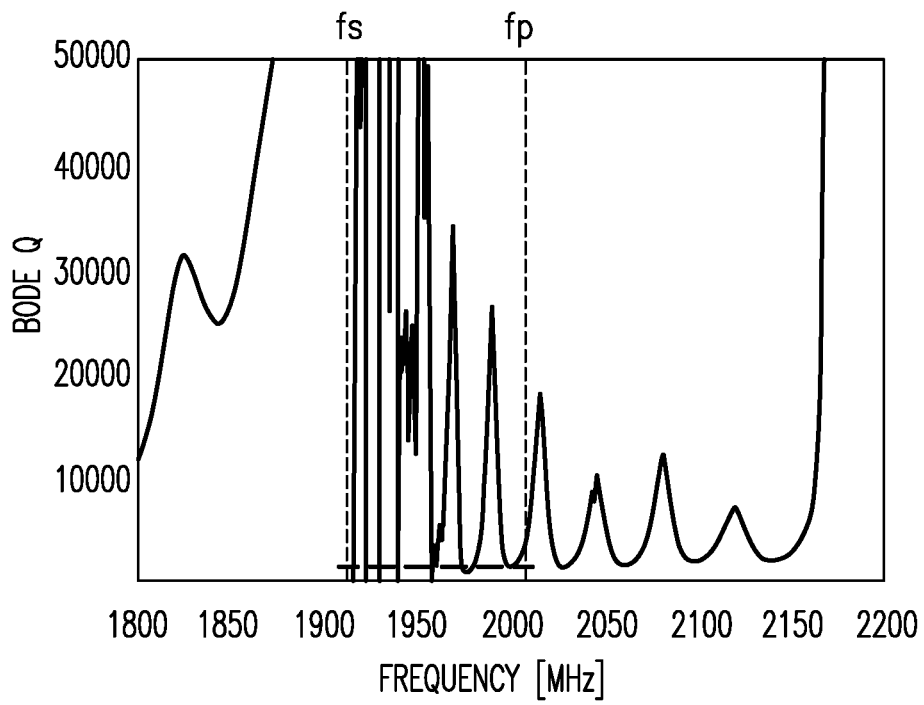
FIG. 3C is a graph illustrating a Bode plot of the Q factor of an exemplary conventional acoustic wave device.
Figure 3D:
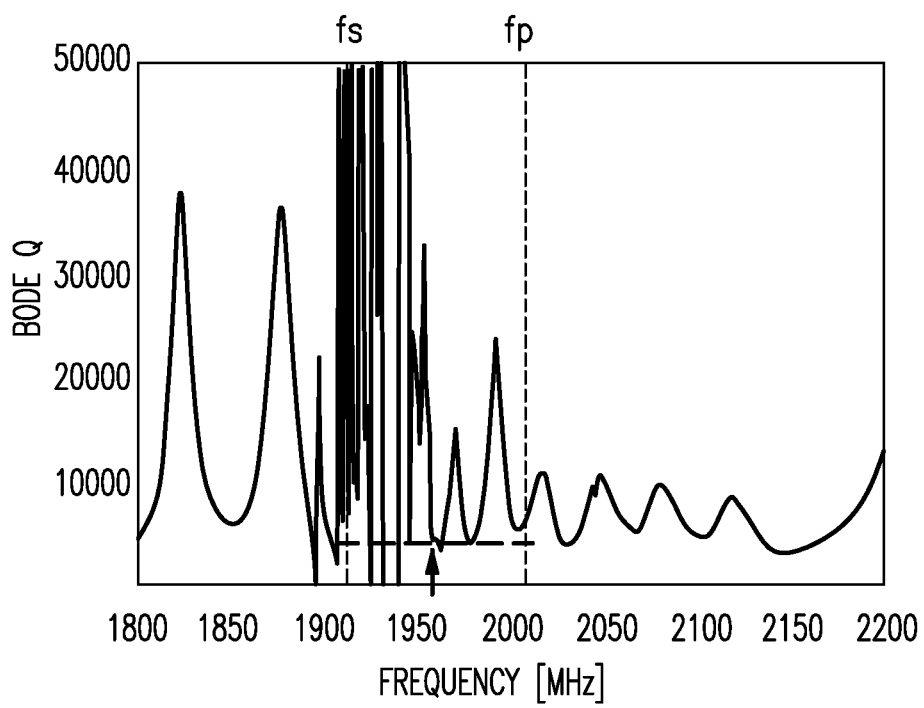
FIG. 3D is a graph illustrating a Bode plot of the Q factor of an acoustic wave device according aspects of the present disclosure.

FIG. 3C shows the results of a simulation of a Bode plot of the Q factor of an acoustic wave resonator using a conventional device such as that shown in FIGS. 1A and 1B. FIG. 3D shows the results of a simulation of a Bode plot of the Q factor of an acoustic wave resonator using a device such as the acoustic wave device 200 of FIGS. 2A and 2B.

As can be seen from the FIG. 3C for a conventional device, the Q factor is degraded after the series resonance frequency fs due to side leakage, shown by the low value between fs and fp. However, when the acoustic wave device 200 of FIGS. 2A and 2B is used, the worst Q value between fs and fp is improved (shown by the increase in FIG. 3D marked by the arrow) due to the high impedance portions 250 reducing any side leakage.

The SAW device 200 of FIGS. 2A and 2B may be used in various different applications. In general, the SAW device 200 may be used in any device that includes an IDT. For example, the SAW device may be used in various types of acoustic wave resonators and/or filters, including 1-port resonators, 2-port resonators, ladder filters, and the like. Although the embodiment above has been described with only one IDT disposed on the multilayer piezoelectric substrate, other configurations are possible, as would be understood by the skilled person.

It should be appreciated that the SAW device 200 illustrated in FIGS. 2A and 2B, as well as the other circuit elements illustrated in other figures presented herein, are illustrated in a highly simplified form. The relative dimensions of the different features are not shown to scale. Further, typical surface acoustic wave devices would commonly include a far greater number of electrode fingers in the IDTs than illustrated.

A method of manufacturing the SAW device of the present invention will now be described. The method will be described in relation to the SAW device 200 of FIGS. 2A and 2B. However, the method could be appropriately adapted to manufacture the other embodiments described herein, as would be understood by the skilled person.

Figure 4A:
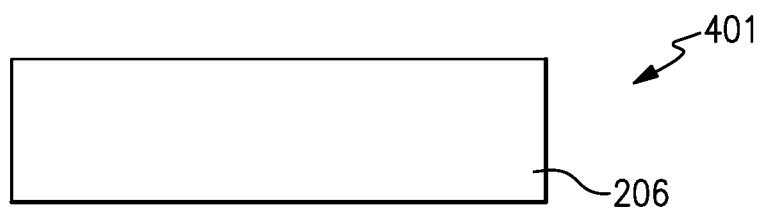
FIG. 4A is a method step of forming an acoustic wave device according to aspects of the present invention.

In step 401 shown in FIG. 4A a layer of piezoelectric material 206 is provided, for example, in the form of a piezoelectric wafer.

Figure 4B:
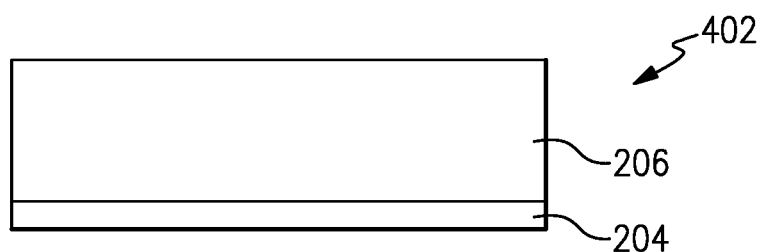
FIG. 4B is a method step of forming an acoustic wave device according to aspects of the present invention.

In step 402 shown in FIG. 4B a layer of dielectric material 204 is disposed on a lower surface of the layer of piezoelectric material 206. The layer of dielectric material 204, for example silicon dioxide, may be grown or deposited on the lower surface of the wafer of piezoelectric material.

Figure 4C:
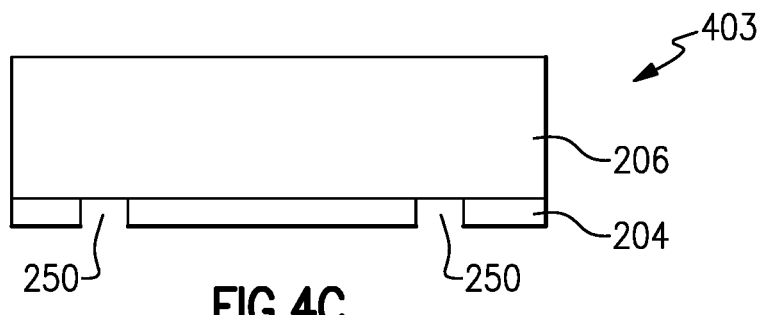
FIG. 4C is a method step of forming an acoustic wave device according to aspects of the present invention.

In step 403 shown in FIG. 4C the first and second high impedance portions 250 are formed. The high impedance portions 250 are formed by removal of sections of dielectric material from the layer of dielectric material 204. The dielectric material may be removed through various means, such as etching or dicing or the like. Etching, for example chemical etching, is the preferred method for removing the dielectric material, as the depth of the material removed may be precisely controlled. However, other methods such as mechanical dicing or laser dicing may also be used.

Once the dielectric material has been removed the resulting air gaps may form the high impedance portions 250, or in alternate embodiments, high impedance materials may be disposed into the resulting gaps to form the high impedance portions.

Figure 4D:
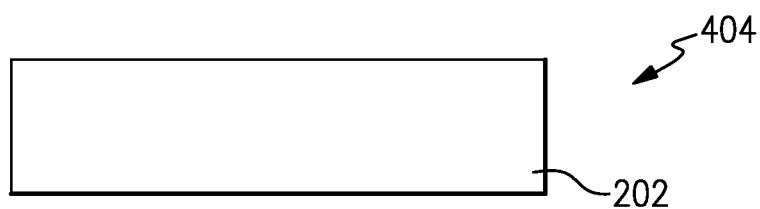
FIG. 4D is a method step of forming an acoustic wave device according to aspects of the present invention.

In step 404 shown in FIG. 4D a carrier substrate 202 is provided. The carrier substrate may be a silicon wafer, for example.

Figure 4E:
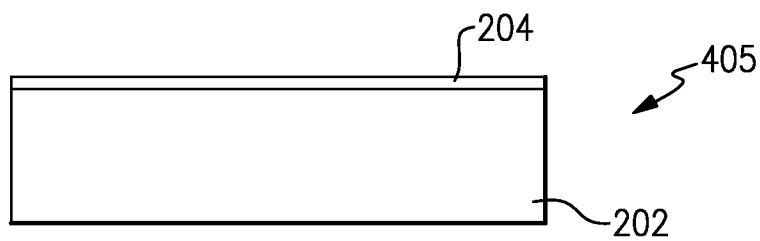
FIG. 4E is a method step of forming an acoustic wave device according to aspects of the present invention.

In step 405 shown in FIG. 4E a layer of dielectric material 204 is disposed on an upper surface of the carrier substrate 202. The layer of dielectric material, for example silicon dioxide, may be grown or deposited on the upper surface of the carrier substrate wafer.

In some embodiments, the first and second high impedance portions 250 may be formed by etching or dicing the layer of dielectric material disposed on the carrier substrate 202 instead of, or as well as, the layer of dielectric material disposed on the piezoelectric substrate 206. In other words, the high impedance portions may be formed in either or both of these layers of dielectric material, before the carrier substrate and piezoelectric material are bonded together in step 406.

Figure 4F:
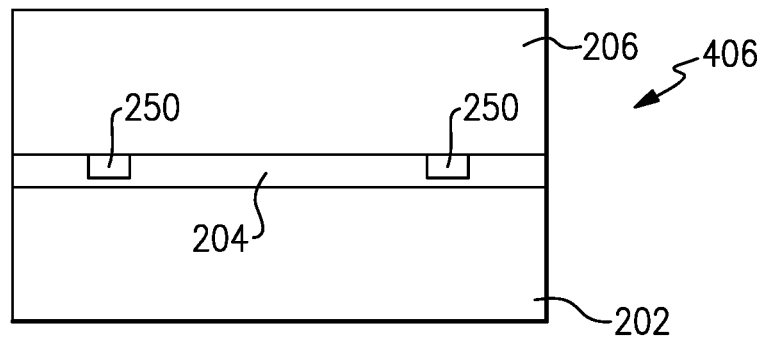
FIG. 4F is a method step of forming an acoustic wave device according to aspects of the present invention.

In step 406 shown in FIG. 4F the carrier substrate and a piezoelectric substrate are joined via the layer of dielectric material. The layer of dielectric material 204 may act as a bonding agent between the carrier substrate 202 and the wafer of piezoelectric material 206. For example, the piezoelectric material and carrier substrate may be joined by anodic bonding or other methods of joining layers of, for example, silicon dioxide, to form the layer of dielectric material 204.

Figure 4G:
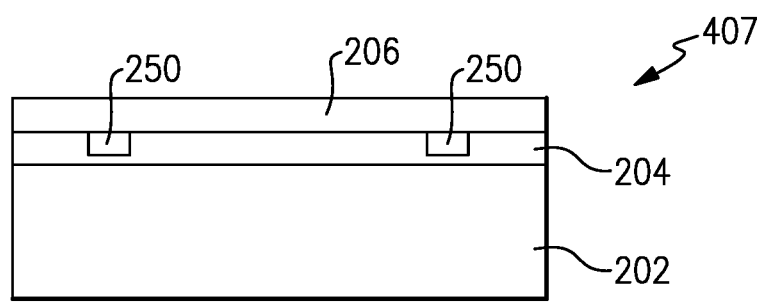
FIG. 4G is a method step of forming an acoustic wave device according to aspects of the present invention.

In step 407 shown in FIG. 4G the layer of piezoelectric material 206 is thinned if necessary. The wafer of piezoelectric material may be thinned after bonding by methods known to the skilled person such as grinding or the like, to produce the thin layer of piezoelectric material 206.

Figure 4H:
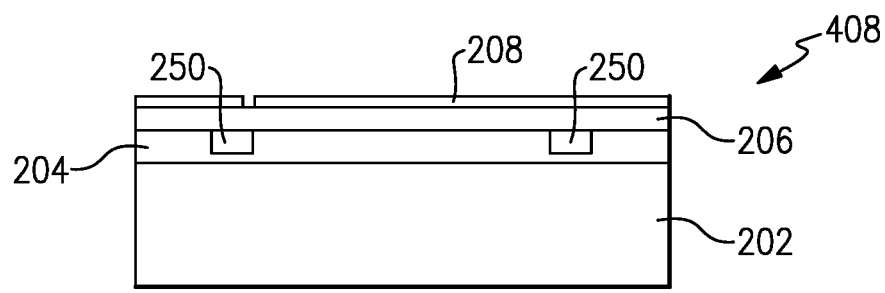
FIG. 4H is a method step of forming an acoustic wave device according to aspects of the present invention.

In step 408 shown in FIG. 4H the IDT 208 is fabricated and disposed on the layer of piezoelectric material 206. Various fabrication methods as known in the art could be used to form the IDT 208. For example, the IDT 208 may be formed through one or more of mask printing, laser etching, dry etching, vapor phase etching, deposition such as physical vapor deposition, electroplating, a lift-off process, or the like.

The IDT 208 is disposed on an upper surface of the layer of piezoelectric material 206, said IDT including an active region 220 positioned between the first and second high impedance portions and configured to generate a surface acoustic wave, with the first and second high impedance portions extending in the direction of propagation of the surface acoustic wave to be generated.

In some embodiments a pair of reflector gratings may also be disposed on the layer of piezoelectric material 206, the reflector gratings opposing each other with the IDT therebetween to form a SAW resonator. The reflector gratings may be formed through similar methods to the IDT 208.

Various alterations could be made to the above described method depending on the specific embodiment being manufactured, as would be understood by the skilled person and discussed in more detail later.

A number of alternative embodiments of the SAW device of the present invention will be now be described in relation to FIGS. 5A to 5C.

Figure 5A:
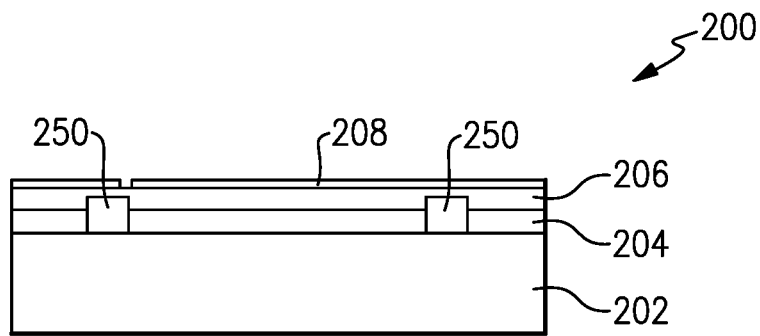
FIG. 5A is a cross-sectional view of an acoustic wave device according to aspects of the present invention.
Figure 5B:
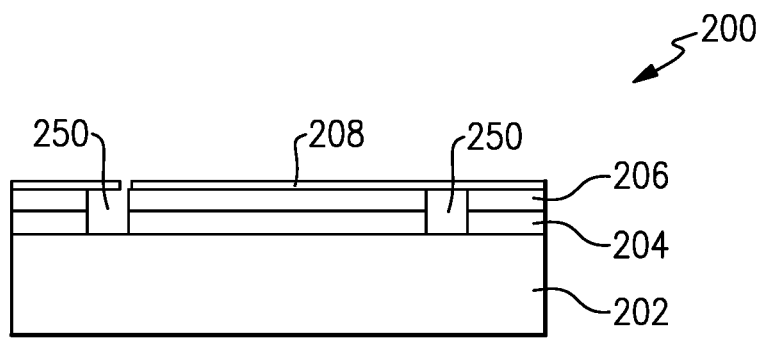
FIG. 5B is a cross-sectional view of an acoustic wave device according to aspects of the present invention.

FIGS. 5A and 5B show SAW devices 200 that are the same as the SAW device of FIGS. 2A and 2B, except that the high impedance portions 250 extend into the layer of piezoelectric material 206 as well as the layer of dielectric material 204. In the embodiment shown in FIG. 5A the high impedance portions extend partially into the layer of piezoelectric material 206, and in the embodiment shown in FIG. 5B the high impedance portions extend through the entire thickness of both the layer of piezoelectric material 206 and layer of dielectric material 204.

Figure 5C:
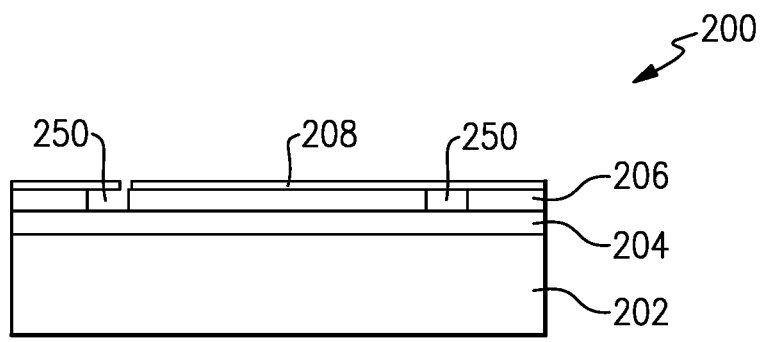
FIG. 5C is a cross-sectional view of an acoustic wave device according to aspects of the present invention.

FIG. 5C shows another embodiment of a SAW device 200. In the embodiment of FIG. 5C the high impedance portions 250 are located in the layer of piezoelectric material 206 only, instead of in the layer of dielectric material 204.

In general, the high impedance portions 250 may be included in either the layer of piezoelectric material 206 or the layer of dielectric material 204, or the high impedance portions 250 may be included in both the layer of piezoelectric material 206 and the layer of dielectric material 204. The high impedance portions 250 may extend partially or fully through the thickness or either or both of the layers of piezoelectric material and dielectric material. Preferably the high impedance portions 250 are included at least in the layer with the lower acoustic impedance, which is the layer of dielectric material 204 in the case of silicon dioxide as the dielectric material and lithium tantalate as the piezoelectric material.

The height of the high impedance portions 250 (measured in the direction perpendicular to the plane of the MPS) may be different in various embodiments. For example, in some embodiments the high impedance portions 250 may have a height equal to the thickness of either the layer of piezoelectric material or the layer of dielectric material. In other embodiments, the high impedance portions 250 may have a height equal to the thickness of the layers of piezoelectric material and dielectric material combined. In other embodiments, the height of the high impedance portions 250 may extend only partially through the thickness of the layer of piezoelectric material 206 and/or the layer of dielectric material 204.

For example, FIG. 4H shows an embodiment with the high impedance portions 250 extending partially through the thickness of the layer of dielectric material 204. Preferably, the height of the high impedance portions 250 extends through at least half the thickness of one of the layer of piezoelectric material 206 or the layer of dielectric material 204. In other words, the first and second high impedance portions 250 preferably each have a height in the direction perpendicular to the plane of the multilayer piezoelectric substrate equal to or greater than about half the thickness of the layer of dielectric material or the layer of piezoelectric material. In one particular embodiment, the layer of piezoelectric material and the layer of dielectric material may each have a thickness of between about $0.1\lambda$ and about $1\lambda$, where $\lambda$ is the wavelength of the main surface acoustic wave generated by the interdigital transducer during operation. In this case, the first and second high impedance portions may each have a height of between about $0.05\lambda$ and about $2\lambda$. It is to be understood that these values are only examples and may be set at different values in different embodiments of SAW devices.

Having high impedance portions 250 with a greater height, in other words extending further through the layers of the MPS in a thickness direction of each layer, provides better reflection of the surface acoustic wave at the high impedance portions. Therefore, high impedance portions with a greater height relative to the thickness of the layer of piezoelectric material 206 and layer of dielectric material 204, such as the embodiment of FIG. 5B, provide the most effective reduction in side leakage. However, in the case of air gaps used as the high impedance portions 250, larger high impedance portions may reduce the structural strength of the SAW device. There is therefore a tradeoff between the effectiveness of the surface acoustic wave reflection and the strength of the SAW device. Using a solid material to form the high impedance portions 250 can overcome this structural weakening.

In embodiments where the high impedance portions 250 extend partially through one or both of the layers, such as in the embodiment shown in FIG. 4H, the high impedance portions 250 may be located at various different depths within the layer. For example, taking the example of FIG. 4H, the high impedance portions could also be located at the bottom of the layer of dielectric material 204, rather than at the top of the layer of dielectric material 204 as shown.

To summarize, the high impedance portions may extend fully through the thickness of both the layer of piezoelectric material 206 and the layer of dielectric material 204, or may extend fully through the thickness of one of the layer of piezoelectric material 206 or the layer of dielectric material 204, or may extend fully through the thickness of one of the layers and partially through the thickness of the other layer, or may extend partially through the thickness of both of the layers, or may extend partially through the thickness of only one of the layers.

Each of the embodiments described above could be manufactured via an appropriately modified version of the method described in relation to FIGS. 4A to 4H, as would be understood by the skilled person. For example, to produce the embodiment shown in FIG. 5A method step 403 could be modified so that as well as the removal of dielectric material, some of the layer of piezoelectric material 206 is also removed via etching or dicing or the like before bonding the MPS together. Alternatively, to produce the embodiments of FIGS. 5B and 5C the method step 403 could be omitted, and instead the layer of piezoelectric material 206 could be etched or diced or the like to form the high impedance portions after method step 407. In other words, after the MPS is bonded together the high impedance portions could be formed before the IDT is fabricated by removal of some of the piezoelectric material. The piezoelectric material may be removed by etching or dicing the upper surface of the layer of piezoelectric material 206. In some cases, such as the embodiment of FIG. 5B, some dielectric material may also be removed along with the piezoelectric material. In summary, the method may be adapted to etch or dice etc. to form the high impedance portions 250 at the appropriate stage, depending on the exact configuration and location of the high impedance portions.

Figure 6A:
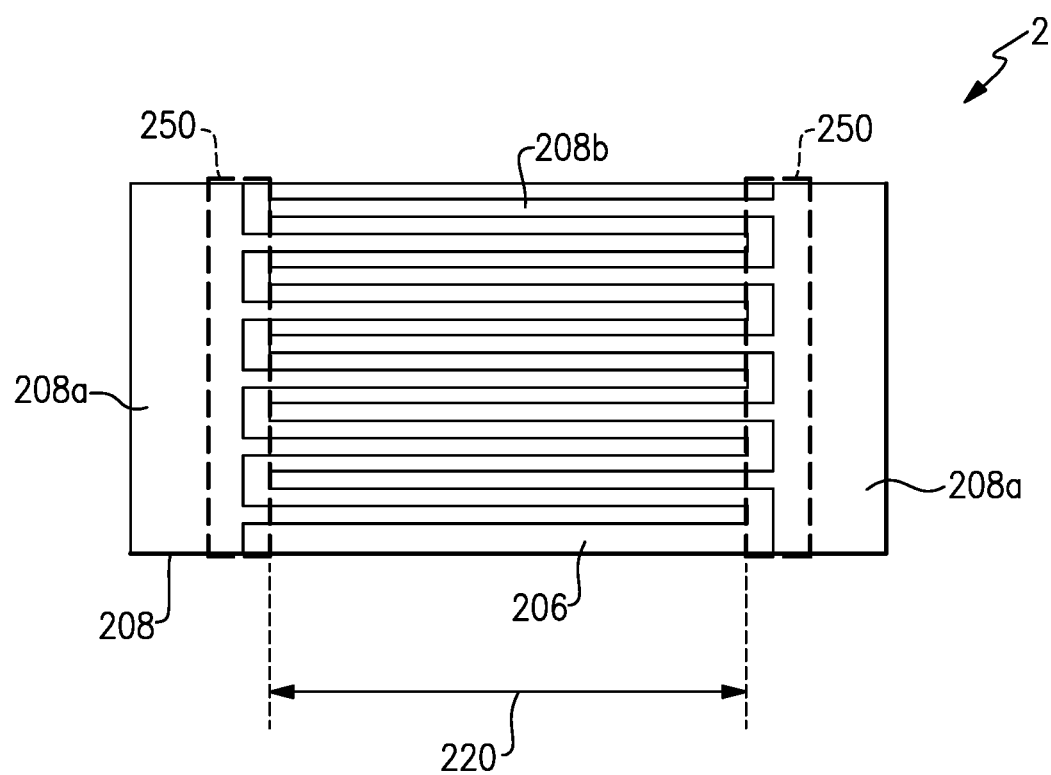
FIG. 6A is a plan view of an acoustic wave device according to aspects of the present invention.
Figure 6B:
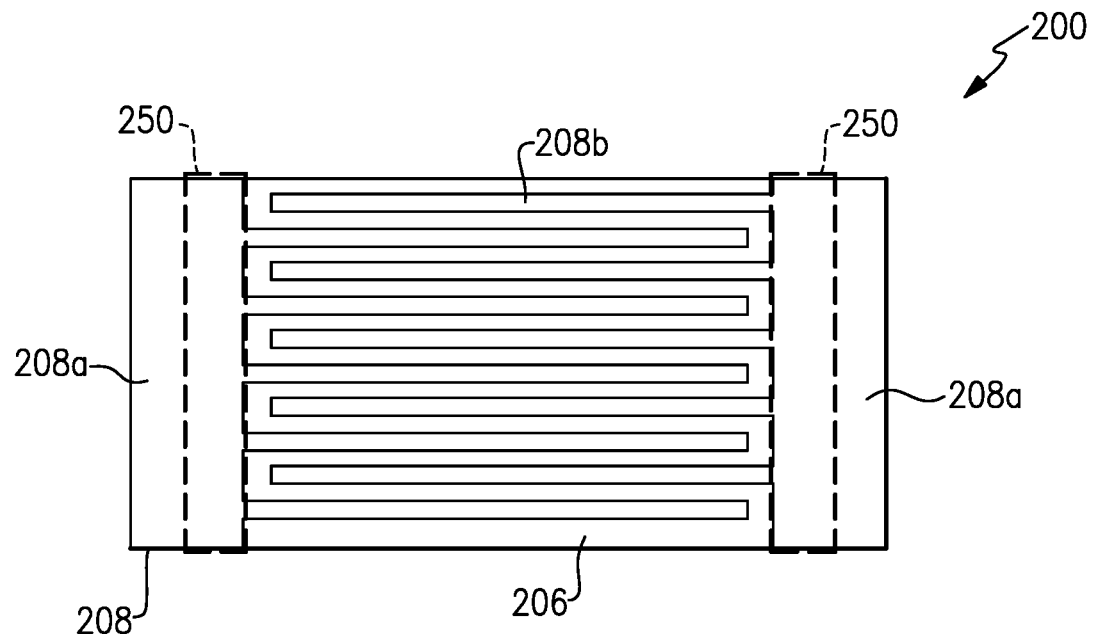
FIG. 6B is a plan view of an acoustic wave device according to aspects of the present invention.

Referring now to FIGS. 6A and 6B, further embodiments of the present invention are considered. FIGS. 6A and 6B show plan views of embodiments with an alternative type of IDT that does not include the dummy electrodes 208c. Instead, the plurality of electrode fingers 208b simply extend towards the opposing bus bar electrode 208a, with a gap formed between each electrode finger 208b and the opposing bus bar electrode 208a. Other than this difference, the embodiments of FIGS. 6A and 6B are the same as described previously. The active region 220 is again the region in which the plurality of electrode fingers 208b overlap, and the high impedance portions may be positioned along the edges of the active region 220 (as shown in FIG. 6A), or along the inner edges of the bus bar electrodes 208a (as shown in FIG. 6B), or anywhere between these two locations. The invention can be applied to any type of IDT, as would be understood by the skilled person.

The described aspects of the present invention each provide a multilayer piezoelectric substrate SAW device with a reduction in side leakage and transverse mode suppression. The high impedance portions provide these improved characteristics without increasing the size of the device, for example through the use of slanted IDT structures or the like.

A typical operating frequency of the SAW device of the present invention may be within a frequency range of 500 MHz to 3 GHz. Based on a velocity of the surface acoustic wave of around 3000 m/s to 4200 m/s, a typical wavelength $\lambda$ of the surface acoustic wave generated by the IDT of the SAW device within this frequency range may be ranged between 1 $\mu m<\lambda<8.4$ $\mu m$. It is to be understood that these values are only examples and may be set at different values in different embodiments of SAW devices.

The SAW devices described herein may be used in various different SAW applications. In general, the SAW devices described herein may be used in any SAW device that includes an IDT, as would be understood by the skilled person. For example, the SAW device may be used in various types of SAW resonators and/or filters, including 1-port resonators, 2-port resonators, ladder filters, and the like. The invention may be applied to filters, duplexers, diplexers or the like, no matter what acoustic mode is (e.g. Rayleigh or shear horizontal (SH)), and no matter what materials are used in the multilayer piezoelectric substrate, IDT(s) and reflector gratings. The reduction in side leakage and the suppression of transverse modes in the above described SAW devices may lead to an overall improvement in the overall functioning of the circuit.

Figure 7:
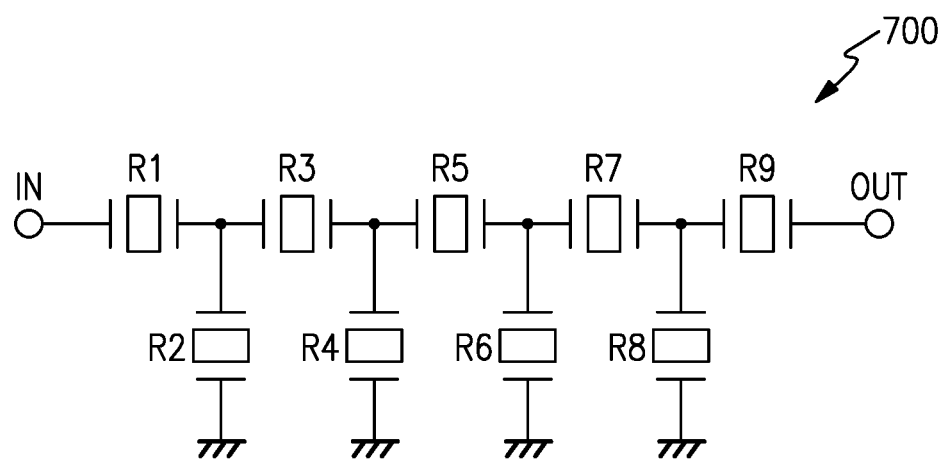
FIG. 7 shows an example of a ladder filter in which multiple acoustic wave devices according to aspects of the present invention may be combined.

For example, FIG. 7 shows an example of a filter 700 which multiple SAW devices as disclosed herein may be combined. FIG. 7 shows an RF ladder filter 700 including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW devices as disclosed herein.

Figure 8:
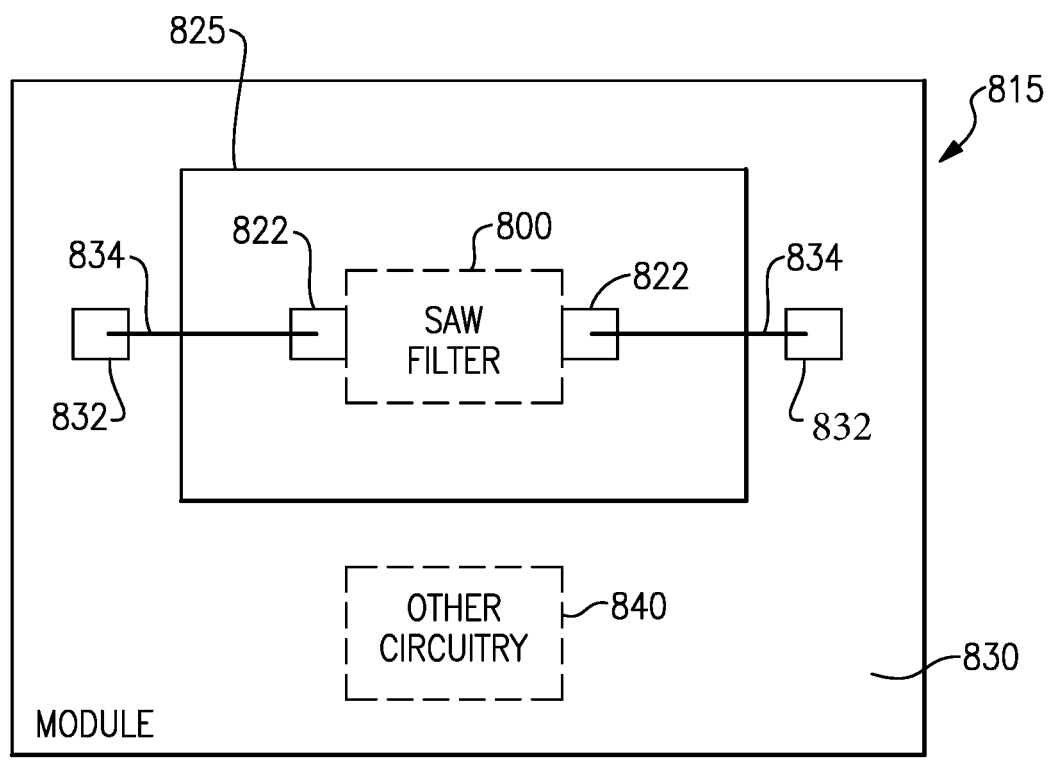
FIG. 8 is a block diagram of one example of a filter module that can include one or more acoustic wave devices according to aspects of the present disclosure.
Figure 9:
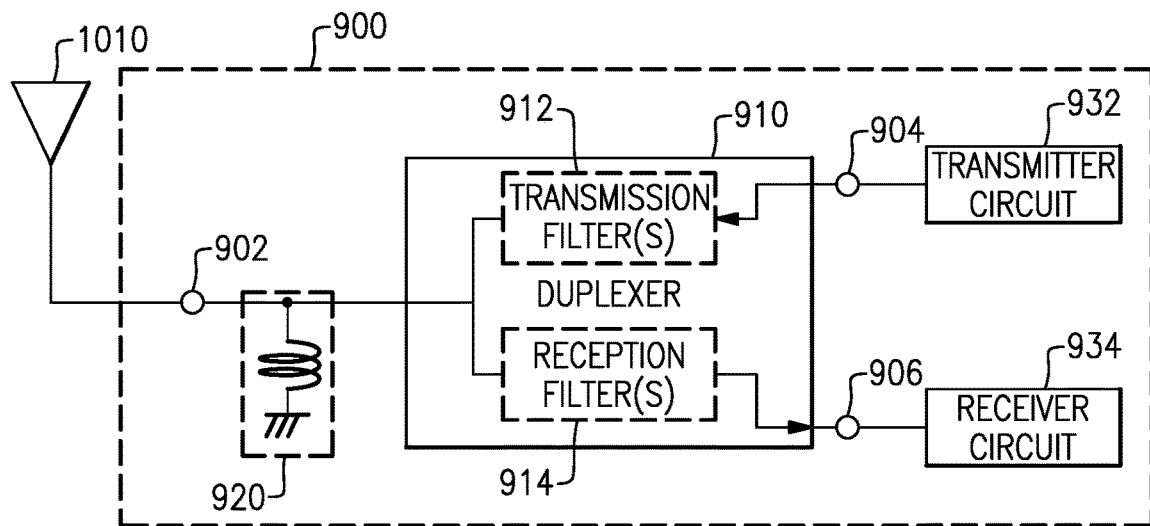
FIG. 9 is a block diagram of one example of a front-end module that can include one or more filter modules including acoustic wave devices according to aspects of the present disclosure.
Figure 10:
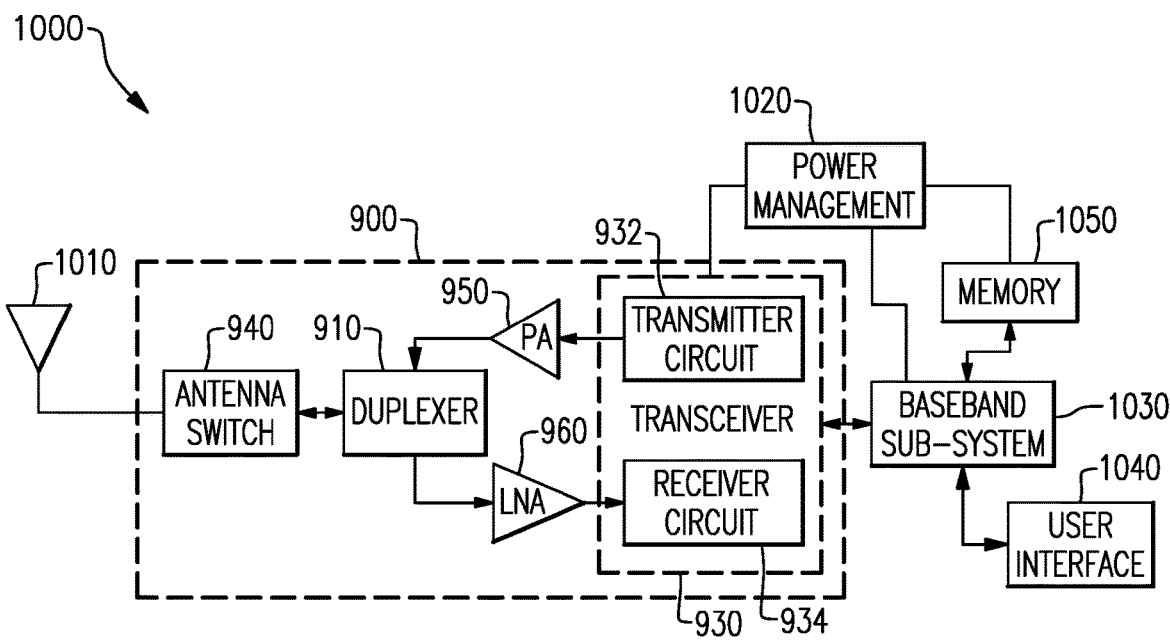
FIG. 10 is a block diagram of one example of a wireless device including the front-end module of FIG. 9.

Moreover, examples an embodiments of SAW devices discussed herein can be implemented in a variety of packaged modules. Some example packaged modules will now be discussed in which any suitable principles and advantages of the SAW devices discussed herein can be implemented. FIGS. 8, 9, and 10 are schematic block diagrams of illustrative packaged modules and devices according to certain embodiments.

As discussed above, surface acoustic wave devices, such as those of FIGS. 2A to 2C, 5A to 5C and 6A to 6B, can be used in SAW radio frequency (RF) filters. In turn, a SAW RF filter using one or more surface acoustic wave elements, such as the SAW filter of FIG. 7, may be incorporated into and packaged as a module that may ultimately be used in an electronic device, such as a wireless communications device, for example. FIG. 8 is a block diagram illustrating one example of a module 815 including a SAW filter 800. The SAW filter 800 may be implemented on one or more die(s) 825 including one or more connection pads 822. For example, the SAW filter 800 may include a connection pad 822 that corresponds to an input contact for the SAW filter and another connection pad 822 that corresponds to an output contact for the SAW filter. The packaged module 815 includes a packaging substrate 830 that is configured to receive a plurality of components, including the die 825. A plurality of connection pads 832 can be disposed on the packaging substrate 830, and the various connection pads 822 of the SAW filter die 825 can be connected to the connection pads 832 on the packaging substrate 830 via electrical connectors 834, which can be solder bumps or wirebonds, for example, to allow for passing of various signals to and from the SAW filter 800. The module 815 may optionally further include other circuitry die 840, for example, one or more additional filter(s), amplifiers, pre-filters, modulators, demodulators, down converters, and the like, as would be known to one of skill in the art of semiconductor fabrication in view of the disclosure herein. In some embodiments, the module 815 can also include one or more packaging structures to, for example, provide protection and facilitate easier handling of the module 815. Such a packaging structure can include an overmold formed over the packaging substrate 830 and dimensioned to substantially encapsulate the various circuits and components thereon.

Various examples and embodiments of the SAW filter 800 can be used in a wide variety of electronic devices. For example, the SAW filter 800 can be used in an antenna duplexer, which itself can be incorporated into a variety of electronic devices, such as RF front-end modules and communication devices.

Referring to FIG. 9, there is illustrated a block diagram of one example of a front-end module 900, which may be used in an electronic device such as a wireless communications device (e.g., a mobile phone) for example. The front-end module 900 includes an antenna duplexer 910 having a common node 902, an input node 904, and an output node 906. An antenna 1010 is connected to the common node 902.

The antenna duplexer 910 may include one or more transmission filters 912 connected between the input node 904 and the common node 902, and one or more reception filters 914 connected between the common node 902 and the output node 906. The passband(s) of the transmission filter(s) are different from the passband(s) of the reception filters. Examples of the SAW filter 800 can be used to form the transmission filter(s) 912 and/or the reception filter(s) 914. An inductor or other matching component 920 may be connected at the common node 902.

The front-end module 900 further includes a transmitter circuit 932 connected to the input node 904 of the duplexer 910 and a receiver circuit 934 connected to the output node 906 of the duplexer 910. The transmitter circuit 932 can generate signals for transmission via the antenna 1010, and the receiver circuit 934 can receive and process signals received via the antenna 1010.

In some embodiments, the receiver and transmitter circuits are implemented as separate components, as shown in FIG. 9, however, in other embodiments these components may be integrated into a common transceiver circuit or module. As will be appreciated by those skilled in the art, the front-end module 900 may include other components that are not illustrated in FIG. 9 including, but not limited to, switches, electromagnetic couplers, amplifiers, processors, and the like.

FIG. 10 is a block diagram of one example of a wireless device 1000 including the antenna duplexer 910 shown in FIG. 9. The wireless device 1000 can be a cellular phone, smart phone, tablet, modem, communication network or any other portable or non-portable device configured for voice or data communication. The wireless device 1000 can receive and transmit signals from the antenna 1010. The wireless device includes an embodiment of a front-end module 900 similar to that discussed above with reference to FIG. 9. The front-end module 900 includes the duplexer 910, as discussed above. In the example shown in FIG. 10 the front-end module 900 further includes an antenna switch 940, which can be configured to switch between different frequency bands or modes, such as transmit and receive modes, for example. In the example illustrated in FIG. 10, the antenna switch 940 is positioned between the duplexer 910 and the antenna 1010; however, in other examples the duplexer 910 can be positioned between the antenna switch 940 and the antenna 1010. In other examples the antenna switch 940 and the duplexer 910 can be integrated into a single component.

The front-end module 900 includes a transceiver 930 that is configured to generate signals for transmission or to process received signals. The transceiver 930 can include the transmitter circuit 932, which can be connected to the input node 904 of the duplexer 910, and the receiver circuit 934, which can be connected to the output node 906 of the duplexer 910, as shown in the example of FIG. 9.

Signals generated for transmission by the transmitter circuit 932 are received by a power amplifier (PA) module 950, which amplifies the generated signals from the transceiver 930. The power amplifier module 950 can include one or more power amplifiers. The power amplifier module 950 can be used to amplify a wide variety of RF or other frequency-band transmission signals. For example, the power amplifier module 950 can receive an enable signal that can be used to pulse the output of the power amplifier to aid in transmitting a wireless local area network (WLAN) signal or any other suitable pulsed signal. The power amplifier module 950 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 950 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 10, the front-end module 900 may further include a low noise amplifier (LNA) module 960, which amplifies received signals from the antenna 1010 and provides the amplified signals to the receiver circuit 934 of the transceiver 930.

The wireless device 1000 of FIG. 10 further includes a power management sub-system 1020 that is connected to the transceiver 930 and manages the power for the operation of the wireless device 1000. The power management system 1020 can also control the operation of a baseband sub-system 1030 and various other components of the wireless device 1000. The power management system 1020 can include, or can be connected to, a battery (not shown) that supplies power for the various components of the wireless device 1000. The power management system 1020 can further include one or more processors or controllers that can control the transmission of signals, for example. In one embodiment, the baseband sub-system 1030 is connected to a user interface 1040 to facilitate various input and output of voice and/or data provided to and received from the user. The baseband sub-system 1030 can also be connected to memory 1050 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 500 MHz to 3 GHz.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An acoustic wave device, comprising:
   a multilayer piezoelectric substrate, the multilayer piezoelectric substrate including a layer of piezoelectric material having a lower surface disposed on an upper surface of a layer of a dielectric material, the dielectric material having a lower surface disposed on an upper surface of a carrier substrate;
   an interdigital transducer disposed on the multilayer piezoelectric substrate, the interdigital transducer including an active region configured to generate an acoustic wave; and
   first and second high impedance portions included within the multilayer piezoelectric substrate, the first and second high impedance portions each positioned outside the active region of the interdigital transducer and extending in a direction of propagation of the acoustic wave to be generated by the interdigital transducer, the first and second high impedance portions included within the layer of dielectric material and/or the layer of piezoelectric material.

2. The acoustic wave device of claim 1 wherein the first and second high impedance portions are air gaps.

3. The acoustic wave device of claim 1 wherein the first and second high impedance portions are formed from a material of high impedance, the material of high impedance including at least one of silicon nitride, silicon, diamond, aluminum nitride, magnesium oxide spinel, magnesium oxide crystal, quartz, diamond-like carbon, or sapphire.

4. The acoustic wave device of claim 1 wherein the first and second high impedance portions are formed by etching or dicing the layer of dielectric material and/or the layer of piezoelectric material during formation of the multilayer piezoelectric substrate.

5. The acoustic wave device of claim 1 wherein the first and second high impedance portions are located on opposing sides of the active region of the interdigital transducer.

6. The acoustic wave device of claim 1 wherein the first and second high impedance portions are configured to confine acoustic waves within a region of the multilayer piezoelectric substrate below the active region of the interdigital transducer.

7. The acoustic wave device of claim 1 wherein the first and second high impedance portions extend along an entire length of the interdigital transducer in the direction of propagation of the acoustic wave to be generated by the interdigital transducer.

8. The acoustic wave device of claim 1 wherein the interdigital transducer includes a pair of opposing bus bar electrodes and a plurality of interlocking electrode fingers that extend from each of the bus bar electrodes and overlap in the active region of the interdigital transducer, the first and second high impedance portions each located adjacent to an edge of the active region, or adjacent to an inner edge of one of the bus bar electrodes, or therebetween.

9. The acoustic wave device of claim 1 wherein each of the first and second high impedance portions has a width in a direction perpendicular to the direction of propagation of the acoustic wave to be generated by the interdigital transducer equal to or greater than about $1\lambda$, where $\lambda$ is the wavelength of the acoustic wave to be generated.

10. The acoustic wave device of claim 1 wherein the layer of piezoelectric material and the layer of dielectric material each have a thickness of between about $0.1\lambda$ and about $1\lambda$, where $\lambda$ is the wavelength of the acoustic wave generated by the interdigital transducer during operation.

11. The acoustic wave device of claim 1 wherein the first and second high impedance portions each have a height in a direction perpendicular to a plane of the multilayer piezoelectric substrate equal to or greater than about half a thickness of the layer of dielectric material or the layer of piezoelectric material.

12. The acoustic wave device of claim 1 wherein the layer of piezoelectric material is formed of a material selected from the group consisting of lithium tantalate, aluminum nitrate, lithium niobate, or potassium niobate.

13. The acoustic wave device of claim 1 wherein the layer of dielectric material includes silicon dioxide or doped silicon material.

14. The acoustic wave device of claim 1 wherein the carrier substrate is formed of a material selected from the group consisting of silicon, aluminum nitride, silicon nitride, magnesium oxide spinel, magnesium oxide crystal, quartz, diamond, diamond-like carbon, or sapphire.

15. The acoustic wave device of claim 1 wherein the interdigital transducer is formed from at least one of aluminum, titanium, chromium, molybdenum, tungsten, copper, gold, silver, platinum, ruthenium, or iridium.

16. The acoustic wave device of claim 1 wherein the first and second high impedance portions are included within the layer of dielectric material but not within the layer of piezoelectric material.

17. An acoustic wave device, comprising:
    a multilayer piezoelectric substrate, the multilayer piezoelectric substrate including a layer of piezoelectric material having a lower surface disposed on an upper surface of a layer of a dielectric material, the dielectric material having a lower surface disposed on an upper surface of a carrier substrate;
    an interdigital transducer disposed on the multilayer piezoelectric substrate, the interdigital transducer including an active region configured to generate an acoustic wave; and
    first and second high impedance portions included within the multilayer piezoelectric substrate, the first and second high impedance portions each positioned outside the active region of the interdigital transducer and extending in a direction of propagation of the acoustic wave to be generated by the interdigital transducer, the first and second high impedance portions formed from a material of high impedance including at least one of silicon nitride, silicon, diamond, aluminum nitride, magnesium oxide spinel, magnesium oxide crystal, quartz, diamond-like carbon, or sapphire.

18. An acoustic wave device, comprising:
    a multilayer piezoelectric substrate, the multilayer piezoelectric substrate including a layer of piezoelectric material having a lower surface disposed on an upper surface of a layer of a dielectric material, the dielectric material having a lower surface disposed on an upper surface of a carrier substrate;

an interdigital transducer disposed on the multilayer piezoelectric substrate, the interdigital transducer including an active region configured to generate an acoustic wave, a pair of opposing bus bar electrodes, and a plurality of interlocking electrode fingers that extend from each of the bus bar electrodes and overlap in the active region of the interdigital transducer; and first and second high impedance portions included within the multilayer piezoelectric substrate, the first and second high impedance portions each positioned outside the active region of the interdigital transducer and extending in a direction of propagation of the acoustic wave to be generated by the interdigital transducer, the first and second high impedance portions each located one of adjacent to an edge of the active region, adjacent to an inner edge of one of the bus bar electrodes, or therebetween.

19. An acoustic wave device, comprising:

a multilayer piezoelectric substrate, the multilayer piezoelectric substrate including a layer of piezoelectric material having a lower surface disposed on an upper surface of a layer of a dielectric material, the dielectric material having a lower surface disposed on an upper surface of a carrier substrate;

an interdigital transducer disposed on the multilayer piezoelectric substrate, the interdigital transducer including an active region configured to generate an acoustic wave; and first and second high impedance portions included within the multilayer piezoelectric substrate, the first and second high impedance portions each positioned outside the active region of the interdigital transducer and extending in a direction of propagation of the acoustic wave to be generated by the interdigital transducer, each of the first and second high impedance portions having a width in a direction perpendicular to the direction of propagation of the acoustic wave to be generated by the interdigital transducer equal to or greater than about $1\lambda$, where $\lambda$ is the wavelength of the acoustic wave to be generated.

20. An acoustic wave device, comprising:

a multilayer piezoelectric substrate, the multilayer piezoelectric substrate including a layer of piezoelectric material having a lower surface disposed on an upper surface of a layer of a dielectric material, the dielectric material having a lower surface disposed on an upper surface of a carrier substrate;

an interdigital transducer disposed on the multilayer piezoelectric substrate, the interdigital transducer including an active region configured to generate an acoustic wave; and first and second high impedance portions included within the multilayer piezoelectric substrate, the first and second high impedance portions each positioned outside the active region of the interdigital transducer and extending in a direction of propagation of the acoustic wave to be generated by the interdigital transducer, the first and second high impedance portions each having heights in a direction perpendicular to a plane of the multilayer piezoelectric substrate equal to or greater than about half a thickness of the layer of dielectric material or the layer of piezoelectric material.

* * * * *